United States Patent
Bose et al.

(10) Patent No.: US 8,589,364 B2
(45) Date of Patent: Nov. 19, 2013

(54) SYSTEM AND METHOD HAVING OPTIMAL, SYSTEMATIC Q-ARY CODES FOR CORRECTING ALL ASYMMETRIC AND SYMMETRIC ERRORS OF LIMITED MAGNITUDE

(75) Inventors: Bella Bose, Corvallis, OR (US); Noha Elarief, Corvallis, OR (US)

(73) Assignee: State of Oregon Acting by and through the State Board of Higher Education on behalf of Oregon State University, Corvallis, OR (US)

( * ) Notice: Subject to any disclaimer, the term of this patent is extended or adjusted under 35 U.S.C. 154(b) by 59 days.

(21) Appl. No.: 13/155,808

(22) Filed: Jun. 8, 2011

(65) Prior Publication Data

US 2011/0320904 A1 Dec. 29, 2011

Related U.S. Application Data

(60) Provisional application No. 61/358,109, filed on Jun. 24, 2010.

(51) Int. Cl.
*G06F 17/30* (2006.01)

(52) U.S. Cl.
USPC ............ 707/697; 707/701; 714/752; 714/774

(58) Field of Classification Search
USPC ......... 707/705, 758, 769, 774, 775, 776, 697, 707/701; 714/701, 746, 752, 759, 773
See application file for complete search history.

(56) References Cited

U.S. PATENT DOCUMENTS

| 7,484,168 | B2 * | 1/2009 | Siegel et al. | 714/801 |
|---|---|---|---|---|
| 8,296,623 | B2 * | 10/2012 | Cassuto et al. | 714/759 |
| 2008/0022194 | A1 * | 1/2008 | Siegel et al. | 714/801 |
| 2008/0168320 | A1 * | 7/2008 | Cassuto et al. | 714/746 |

OTHER PUBLICATIONS

Vaidya N. F., Unidirectional Error Control Codes, 1993, IEEE, 120-129.*

R. Ahlswede, H. Aydinian, L. H. Khachatrian, and L. M. G. M. Tolhuizen, "On q-ary codes correcting all unidirectional errors of a limited magnitude", pp. 1-22, Jul. 27, 2006.

R. Ahlswede, H. Aydinian and L. H. Khachatrian, "Unidirectional error control codes and related combinatorial problems", Proceedings of Eight International Workshop on Algebraic and Combinatorial Coding Theory, Russia, pp. 6-9, Sep. 2002.

Y. Cassuto, M. Schwartz, V. Bohossian and J. Bruck, "Codes for multi-level flash memories: correcting asymmetric limited-magnitude errors", Proceedings of ISIT2007, Nice, France, Jun. 2007.

S. D. Constantin and T. R. N. Rao, "On the theory of binary asymmetric error correcting codes", Information and computation, vol. 40, pp. 20-36, 1979.

B. Eitan, R. Kazerounian, A. Roy, G. Crisenza, P. Cappelletti and A. Modelli, "Multilevel flash cells and their trade-offs", International Electron Devices Meeting, pp. 169-172, Dec. 1996.

(Continued)

*Primary Examiner* — Jean B Fleurantin
(74) *Attorney, Agent, or Firm* — Niels Haun; Dann, Dorfman, Herrell & Skillman, PC

(57) ABSTRACT

A computer-implemented method and computer program product comprising optimal, systematic q-ary codes for correcting all asymmetric and symmetric errors of limited magnitude are provided.

16 Claims, 1 Drawing Sheet

(56) References Cited

OTHER PUBLICATIONS

J. R. Pierce, "Optical Channels: Practical Limits with Photon Counting", IEEE Trans. Communications, vol. 26, No. 12, pp. 1819-1821, Dec. 1978.

R. R. Varshamov, "A class of codes for asymmetric channels and a problem from the additive theory of numbers", IEEE Trans. Inform. Theory, vol. 19, No. 1, pp. 92-95, Jan. 1973.

T. Klove, "Error correcting codes for the asymmetric channel", In Dept. Mathematics, Univ. Bergen, Bergen, Norway, Tech. Tep. 1809-0781, 1995.

D. Pradhan, "A New Class of Error-Correction/Detecting Codes for Fault-tolerant Computer Applications", IEEE Transactions on Computers, vol. C-29, No. 6, pp. 471-481, Jun. 1980.

B. Bose, et al., "Theory of Unidirectional Error Correcting/Detecting Codes", IEEE Transactions on Computers, vol. C-31, No. 6, pp. 521-530, Jun. 1982.

K. Matsuzawa, et al., "Masking Asymmetric Line Faults Using Semi-Distance Codes", NTT Communications and Information Processing Laboratories, Musashino-shi, Tokoyo 180, Japan, pp. 354-359, 1988.

* cited by examiner

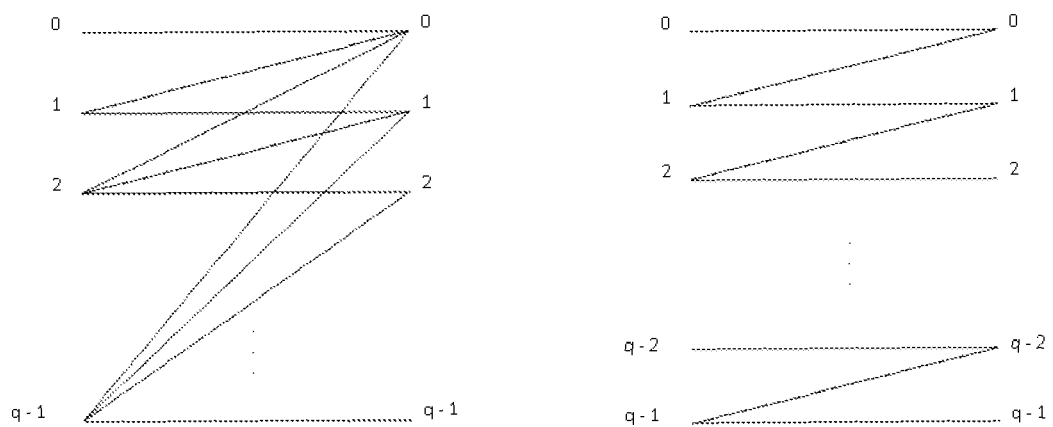

US 8,589,364 B2

SYSTEM AND METHOD HAVING OPTIMAL, SYSTEMATIC Q-ARY CODES FOR CORRECTING ALL ASYMMETRIC AND SYMMETRIC ERRORS OF LIMITED MAGNITUDE

RELATED APPLICATIONS

This application claims the benefit of priority of U.S. Provisional Application No. 61/358,109, filed on Jun. 24, 2010, the entire contents of which application(s) are incorporated herein by reference.

GOVERNMENT LICENSE RIGHTS

This invention was made with government support under Grant Nos. CCF0701452 and CCF0728810 awarded by National Science Foundation. The government has certain rights in the invention.

FIELD OF THE INVENTION

The present invention relates generally to a systems and methods for correcting errors of limited magnitude, and more particularly, but not exclusively, to computer program products and computer-implemented methods for correcting all asymmetric and symmetric errors of limited magnitude.

BACKGROUND OF THE INVENTION

Classical error control codes have been designed under the assumption of binary symmetric errors, i.e. both 1→0 and 0→1 errors can occur during transmission. Nevertheless, errors in some VLSI and optical systems are asymmetric in nature (5, 8). For example, in VLSI circuits and memories, charges may leak with time but new charges will not be added. Thus, a suitable channel model for such systems is the binary asymmetric channel (Z-channel) where errors are of one dominant type known a priori, say 1→0 errors. In Varshamov et al. (9), Varshamov introduced the q-ary asymmetric channel where the channel's input/output symbols are over the alphabet Q={0, 1, ..., q−1}. Moreover, such channel has the property that, when a symbol a∈Q is transmitted, the corresponding received symbol is in the set {0, 1, ..., a}, assuming a decreasing error.

Similar to the asymmetric channel is the unidirectional channel; the difference is that the type of error is not known a priori. Asymmetric/unidirectional error control codes have been the subject of many research work (3, 7).

Not until recently has the notion of limited magnitude asymmetric errors been introduced (2); we say that a vector $(x_{n-1}, x_{n-2}, \ldots, x_0)$ over $Z_q$ suffers an asymmetric error of maximum magnitude/level 1≤q−1 if and only if the corresponding channel output $(x'_{n-1}, x'_{n-2}, \ldots, x'_0)$ is such that $x_i' \in \{x_i-l, x_i-l+1, \ldots, x_i\}$, with $x_i' \in Q$. FIG. 1 illustrates the difference between the traditional q-ary asymmetric channel and the q-ary asymmetric channel with level l=1.

In Cassuto et al. (4), an interesting application for this special case of q-ary asymmetric channel was pointed out: multi-level flash memories. Unlike traditional single-level flash memories where each cell stores only one bit, multi-level flash memories achieve higher storage capacities and thus lower manufacturing costs by programming the cells into one of q>2 threshold voltage thereby storing $\log_2 q$ bits per cell. Nevertheless, increasing the number of threshold levels imposes an important challenge (6): the voltage difference between states is narrowed since—technically—the voltage window is limited. A natural consequence is that reliability issues such as low data retention and read/write disturbs become more significant (4); errors in such cases are typically in one dominant direction and of limited magnitude.

In Ahlswede et al. (1), the authors introduced codes capable of correcting all asymmetric errors of limited magnitude l (or l-AEC codes for short). However, the proposed codes are non-systematic. A systematic code, where the information symbols are separated from the check symbols, is advantageous over a non-systematic code because, in a systematic code, the data processing and encoding/decoding can be done in parallel. Thus, there is a need in the art for a systematic codes for correcting all asymmetric and symmetric errors of limited magnitude.

SUMMARY OF DISCLOSURE

In one of its aspects, the present disclosure provides systems and methods for correcting all q-ary asymmetric errors of limited magnitude l, where 1≤q−2. These systems and methods are advantageous in that the information symbols are separable from the check symbols. Moreover, the systems and methods may use the minimum possible redundancy. An optimal systematic code for correcting all symmetric errors of maximum level l (l-SEC code) is also provided, where $$l \le \frac{q-2}{2},$$

based on the similarities between l-SEC and l-AEC codes.

For example, an exemplary method includes a computer-implemented method for systematic encoding of an information vector for use in correction of all asymmetric errors of maximum magnitude l, comprising: providing a q-ary information vector having k information digits, $(x_{k-1}, x_{k-2}, \ldots, x_0)$; computing a, the value of $(x_{k-1}, x_{k-2}, \ldots, x_0) \bmod (l+1)$ as a vector over (l+1) according to the formula $a = y_{k-1}(l+1)^{k-1} + y_{k-2}(l+1)^{k-2} + \ldots + y_0(l+1)^0$, where $y_i = x_i \bmod(l+1)$, $i \in \{0, 1, \ldots, k-1\}$; representing a in radix $$\lceil \frac{q}{l+1} \rceil$$

number with r digits: $(a_{r-1}, a_{r-2}, \ldots, a_0)$, where $$r \ge \frac{k \times \log(l+1)}{\log\lceil \frac{q}{l+1} \rceil};$$

computing the check part, c, according to the formula $c=(c_{r-1}, c_{r-2}, \ldots, c_0)$, where $c_i=(l+1)a_i$, $\forall i \in \{0, 1, \ldots, r-1\}$; and outputting an encoded vector that includes the information digits and check part. In addition, a computer program product is provided, comprising a computer-readable medium having a computer readable program code adapted to be executed to implement the above-method.

Still further, the present disclosure provides a computer-implemented method for systematic decoding of an information vector for use in correction of all asymmetric errors of maximum magnitude l, comprising: providing a q-ary encoded vector that includes an information vector having k received information digits, $(x'_{k-1}, x'_{k-2}, \ldots, x'_0)$ and having received check symbols $(c'_{r-1}, c'_{r-2}, \ldots, c'_0)$, where $$r \geq \frac{k \times \log(l+1)}{\log\lceil \frac{q}{l+1} \rceil};$$

recovering the check symbols ($c_{r-1}, c_{r-2}, \ldots, c_0$) by rounding each received check symbol which is not a multiple of (l+1) upwards to the nearest multiple of (l+1); computing a, the value of $$\left(\frac{c_{r-1}}{l+1}, \frac{c_{r-2}}{l+1}, \ldots, \frac{c_0}{l+1}\right)$$

as a vector over $$Z_{\lceil \frac{q}{l+1} \rceil}$$

$$\text{as } a = \left(\frac{c_{r-1}}{l+1}\right)\lceil \frac{q}{l+1} \rceil^{r-1} + \left(\frac{c_{r-2}}{l+1}\right)\lceil \frac{q}{l+1} \rceil^{r-2} + \ldots + \left(\frac{c_0}{l+1}\right)\lceil \frac{q}{l+1} \rceil^0;$$

representing a in radix (l+1) number with k digits as $y=(y_{k-1}, y_{k-2}, \ldots, y_0)$; computing $e_i=(y_i-x'_i) \bmod (l+1)$; and computing the corrected codeword, $(x_{k-1}, x_{k-2}, \ldots, x_0)$, as $x_i=x'_i+e_i$, where $i=0, 1, \ldots, k-1$. The present disclosure also provide analogous correction methods relating to symmetric errors of maximum magnitude l.

BRIEF DESCRIPTION OF THE DRAWINGS

The foregoing summary and the following detailed description of the preferred embodiments of the present invention will be best understood when read in conjunction with the appended drawings, in which FIG. 1 illustrates q-ary asymmetric channel (left) vs q-ary asymmetric channel with level 1 (right).

DETAILED DESCRIPTION OF THE DISCLOSURE

The present disclosure provides methods and systems that address the need for error correction of q-ary systems, i.e., those for which q>2. In this regard, in one of its aspects the present invention provides systematic q-ary codes for correcting all asymmetric and symmetric errors of limited magnitude. For example, the present disclosure provides a computer-implemented method and a computer program product for systematic encoding of an information vector for use in correction of all asymmetric errors of maximum magnitude l. The rationale and justification for such methods may be understood in view of the following exposition detailing the formulation of the methods and systems of the present disclosure.

Turning first to a few preliminary principles upon which the present disclosure builds, it turns out that the knowledge of the maximum error level gives nice properties that can be used in the design of error correcting codes. We start by defining a distance metric capturing these properties as introduced in R. Ahlswede et al. (1)

By definition, let $x=(x_{n-1}, x_{n-2}, \ldots, x_0)$ and $y=(y_{n-1}, y_{n-2}, \ldots, y_0)$ be two vectors over $Z_q$, then the distance between x and y is defined as:

$$d(x,y)=\max\{|x_i-y_i|:i\in\{0,1,\ldots,n-1\}\}.$$

It is worth noting that, by properties of absolute values, d(x,y) defines a metric. Moreover, $d(x,y) \leq q-1$ by definition.

The following theorem gives the necessary and sufficient conditions on the minimum distance of an l-AEC code.

Theorem 1 (1): A code $C \subset Q^n$ is an l-AEC code if and only if, for all distinct codewords, x, y∈C, $d(x,y) \geq l+1$.

Let $A_a(n,l,q)$ denote the maximum number of codewords in a q-ary l-AEC code of length n. A bound on $A_a(n,l,q)$ and a non-systematic l-AEC code achieving this bound are given in (1):

Theorem 2 (1): $\forall n \in \{1, 2, 3 \ldots\}$ and l∈Q, $$A_a(n,l,q) = \lceil \frac{q}{l+1} \rceil^n.$$

Theorem 3 (1): Let C be a code of length n over $Z_q$ defined as $$C=\{(x_{n-1},x_{n-2},\ldots,x_0):x_i \equiv 0 \bmod (l+1), \forall i \in \{0,1,\ldots,n-1\}\}$$

Then, C is an l-AEC code with $$\lceil \frac{q}{l+1} \rceil^n$$

codewords.

Finally, for further analysis, x mod a denotes the component-wise remainder of a vector x when divided by an integer a.

Lower Bound on the Number of Check Digits

In the following theorem, the minimum number of check digits needed to encode information vectors of a certain length is presented, which serves, in part, to validate the optimal nature of an l-AEC method/code of the present disclosure.

Theorem 4: Let C be a systematic q-ary l-AEC code, such that the number of information digits in a codeword is k. Then, the number of check digits, r, satisfies the following condition, $$r \geq \frac{k \times \log(l+1)}{\log\lceil \frac{q}{l+1} \rceil}.$$

Proof. Consider the subset of information vectors, $V=\{(x_{k-1}, x_{k-2}, \ldots, x_0): 0 \leq x_i \leq l, \forall i \in \{0, 1, \ldots, k-1\}\}$. Vectors of V can be viewed as the set of all vectors of length k over $Z_{l+1}$. Hence, $\forall x, y \in V, d(x,y) \leq l$, and $|V|=(l+1)^k$. Therefore, by Theorem 1, the checks assigned to vectors in V must be at least l+1 apart for errors to be successfully corrected. Theorem 1 and Theorem 2.2 together give a bound on the number of vectors satisfying such criterion and we get:

$$\lceil \frac{q}{l+1} \rceil^r \geq (l+1)^k$$

Taking the log on both sides of the above inequality we get the desired property. Q.E.D.

One important implication of the above theorem is that it is not possible to design a systematic code correcting all errors of maximum magnitude l when l=q−1, since the expression $$\frac{k \times \log(l+1)}{\log\lceil\frac{q}{l+1}\rceil}$$

goes to infinity in this case. Therefore, for the following discussion of the l-AEC case, an assumption is made that $1 \le q-2$.

An Optimal Systematic l-AEC Code

A method relating to an encoding algorithm is presented for codes which require exactly $$r = \left\lceil\frac{k \times \log(l+1)}{\log\lceil\frac{q}{l+1}\rceil}\right\rceil$$

check digits, though the present disclosure can also encompasses codes in which $$r \ge \left\lceil\frac{k \times \log(l+1)}{\log\lceil\frac{q}{l+1}\rceil}\right\rceil.$$

l-AEC Encoding Algorithm

Input: The information vector: $(x_{k-1}, x_{k-2}, \ldots, x_0)$
Output: The encoded vector: $x=(x_{k-1}, x_{k-2}, \ldots, x_0, c_{r-1}, c_{r-2}, \ldots, c_0)$
A method of the present invention for l-AEC encoding may then include the steps of:
1. Computing a, the value of $(x_{k-1}, x_{k-2}, \ldots, x_0) \mod(l+1)$ as a vector over $(l+1)$:

$a = y_{k-1}(l+1)^{k-1} + y_{k-2}(l+1)^{k-2} + \ldots + y_0(l+1)^0$, where $y_i = x_i \mod(l+1)$, $i \in \{0, 1, \ldots, k-1\}$.
That is, a is the number with radix $(l+1)$ representation of $(x_{k-1}, x_{k-2}, \ldots, x_0) \mod(l+1)$.
2. Representing a in radix $$\lceil\frac{q}{l+1}\rceil$$

number with r digits: $(a_{r-1}, a_{r-2}, \ldots, a_0)$.
3. Computing the check part:

$c = (c_{r-1}, c_{r-2}, \ldots, c_0)$, where $c_i = (l+1)a_i$, $\forall i \in \{0, 1, \ldots, r-1\}$.

4. Outputting the encoded vector $x=(x_{k-1}, x_{k-2}, \ldots, x_0, c_{r-1}, c_{r-2}, \ldots, c_0)$.

EXAMPLE 1

The word (6,2,8,1) is encoded over $Z_{10}$, assuming a maximum error level of 2. The minimum number of check digits needed is $$r = \left\lceil\frac{4\log(2+1)}{\log\lceil\frac{10}{2+1}\rceil}\right\rceil = 4.$$

With notations as above, $a = 0 \times 3^3 + 2 \times 3^2 + 2 \times 3^1 + 1 \times 3^0 = 25$ and thus (0,1,2,1) is the representation of a in base 4. Therefore, the encoded codeword is (6,2,8,1,0,3,6,3).

The following theorem further supports the optimal nature of the above method. Theorem 5: The above construction yields codewords of minimum distance l+1. Proof. Given two distinct information vectors: $v_1 = (x_{k-1}, x_{k-2}, \ldots, x_0)$ and $v_2 = (y_{k-1}, y_{k-2}, \ldots, y_0)$, there are two possibilities: $v_1 \mod(l+1) \ne v_2 \mod(l+1)$ in which case each vector is assigned different check digits and, since the check digits are multiples of $(l+1)$, the distance between the resulting codewords is at least l+1. For the second case, $v_1 \mod(l+1) = v_2 \mod(l+1)$, $v_1$ and $v_2$ are assigned the same check digits. Nevertheless, by distinctness of $v_1$ and $v_2$, $\exists i \in \{0, 1, \ldots, k-1\}$ such that $x_i = y_i + m(l+1)$, $m \ge 1$. Therefore, $d(v_1, v_2) \ge l+1$, and the resulting codewords satisfy the desired property. Q.E.D.

l-AEC Decoding Algorithm

Input: The channel output: $x' = (x'_{k-1}, x'_{k-2}, \ldots, x'_0, c'_{r-1}, c'_{r-2}, \ldots, c'_0)$
Output: The recovered codeword: $(x_{k-1}, x_{k-2}, \ldots, x_0, c_{r-1}, c_{r-2}, \ldots, c_0)$
A method of the present invention for l-AEC decoding may then include the steps of:
1. Recovering the check symbols, $(c_{r-1}, c_{r-2}, \ldots, c_0)$, by rounding each received check symbol which is not a multiple of $(l+1)$ upwards to the nearest multiple of $(l+1)$.
2. Computing a, the value of $$\left(\frac{c_{r-1}}{l+1}, \frac{c_{r-2}}{l+1}, \ldots, \frac{c_0}{l+1}\right)$$

as a vector over $$Z_{\lceil\frac{q}{l+1}\rceil}:$$

$$a = \left(\frac{c_{r-1}}{l+1}\right)\left\lceil\frac{q}{l+1}\right\rceil^{r-1} + \left(\frac{c_{r-2}}{l+1}\right)\left\lceil\frac{q}{l+1}\right\rceil^{r-2} + \ldots + \left(\frac{c_0}{l+1}\right)\left\lceil\frac{q}{l+1}\right\rceil^0.$$

That is, a is the number with radix $$\lceil\frac{q}{l+1}\rceil$$

representation of $$\left(\frac{c_{r-1}}{l+1}, \frac{c_{r-2}}{l+1}, \ldots, \frac{c_0}{l+1}\right).$$

3. Representing a in radix $(l+1)$ number with k digits:

$y = (y_{k-1}, y_{k-2}, \ldots, y_0)$.

4. Letting $e_i = (y_i - x'_i) \mod(l+1)$, where the information symbols are::

$(x_{k-1}, x_{k-2}, \ldots, x_0)$, such that $x_i = x'_i + e_i$, $i = 0, 1, \ldots, k-1$.

5. Outputting the codeword: $(x_{k-1}, x_{k-2}, \ldots, x_0, c_{r-1}, c_{r-2}, \ldots, c_0)$.

EXAMPLE 2

Let the encoded word be as in Example 1 and the channel output be x'=(4,2,7,1,0,3,5,1). Rounding the check symbols which are not multiple of three upwards to the nearest multiple of 3, we get (0,3,6,3). As in Steps 2 and 3 of the algorithm, we compute $a=0121_4=25$, and $y=(0,2,2,1)$. Thus, the correct information symbols are $(6,2,8,1)$.

The following theorem validates the above decoding method. Theorem 6: Let x be a codeword encoded using the encoding algorithm given in above, and let x' be the l-asymmetric channel output. Then, the above l-AEC decoding method successfully recovers x. Proof Let $x=(x_{k-1}, x_{k-2}, \ldots, x_0, c_{r-1}, c_{r-2}, \ldots, c_0)$, then, by the channel properties, $x'=(x'_{k-1}, x'_{k-2}, \ldots, x'_0, c'_{r-1}, c'_{r-2}, \ldots, c'_0)$ is such that $x_i - l \leq x'_i \leq x_i$ and $c_i - l \leq c'_i \leq c_i$. Moreover, the encoding algorithm yields check symbols that are multiples of $l+1$, i.e. $c'_i$ lies between two successive multiples of $l+1$. Therefore, the first step of the decoding algorithm successfully recovers the check symbols. It can also be seen that Steps 2 and 3 of the above decoding algorithm do the reverse operations of Steps 1 and 2 of the encoding algorithm. Hence, with notations as above, $y=(y_{k-1}, y_{k-2}, \ldots, y_0)=(x_{k-1}, x_{k-2}, \ldots, x_0) \mod(l+1)$. At Step 4, $e_i$ can be seen as the magnitude of the error at the information symbol, such that $$x_i = x'_i + e_i \equiv y_i (\mod(l+1)).$$

Thus, $$e_i \equiv (y_i - x'_i)(\mod(l+1)).$$

Since the maximum error magnitude is $l$ (i.e. $0 \leq e_i \leq l$) the value of $e_i$ is successfully computed at Step 4 of the decoding algorithm, recovering the information symbols. Q.E.D.

An Optimal Systematic l-SEC Code

In addition to methods relating to correction of all asymmetric errors of limited magnitude, the present invention provides methods for correcting symmetric error of l limited magnitude.

For a vector $x=(x_{n-1}, x_{n-2}, \ldots, x_0)$ over Z, the corresponding channel output $x'=(x'_{n-1}, x'_{n-2}, \ldots, x'_0)$ suffers a symmetric error of maximum magnitude l if and only if $x_i - e_i \leq x'_i \leq x_i + e_i$, where $0 \leq e_i \leq l$, $\forall i \in \{0, 1, \ldots, n\}$. As shown below, the similarity between the properties of l-SEC codes and l-AEC codes allows extension of the l-AEC methods to a family of l-SEC methods.

The following theorems serve to set conditions that should be met for an optimal l-SEC code. Theorem 7: A code C is capable of correcting all symmetric errors of maximum magnitude l if and only if C has minimum distance $2l+1$. Proof. Let $S_x$ be the set of all words obtained from a codeword $x \in C$, where $|x|=n$, due to n or less symmetric errors of maximum magnitude l, i.e. $S_x = \{(x'_{n-1}, x'_{n-2}, \ldots, x'_0): x'_i = x_i \pm e_i, e_i \in \{0, 1, \ldots, l\}\}$. Then, it is easy to see that, if C has minimum distance $2l+1$, then $\forall x, y \in C$, $S_x \cap S_y = \emptyset$. Therefore, C is an l-SEC code. Conversely, if $\exists x, y \in C$ such that $d(x,y) \leq 2l$, then it is possible to obtain a word, say z, from both x and y due to symmetric errors of magnitude l or less. Hence, a decoder for C cannot correct z. Therefore, the minimum distance should be no less than $2l+1$ for C to be capable of correcting all symmetric errors of maximum magnitude l. Q.E.D.

The above theorem implies that, when $$l > \frac{q-2}{2},$$

any l-SEC code can have at most one codeword. Thus, we assume $$l \leq \frac{q-2}{2}.$$

Theorem 8: Let $A_s(n,l,q)$ denote the maximum number of words in a q-ary l-SEC code of length n. Then $$A_s(n, l, q) = \left\lceil \frac{q}{2l+1} \right\rceil^n.$$

Proof Similar to the proof of Theorem 2. Q.E.D.

Theorem 9: Let C be a code of length n over $Z_q$ defined as:

$C=\{(x_{n-1}, x_{n-2}, \ldots, x_0): x_i \equiv 0 (\mod(2l+1)), \forall i \in \{0,1,\ldots,n-1\}\}.$ Then, C is an l-SEC with $A_s(n,l,q)$ codewords. Proof. Similar to the proof of Theorem 3. Digits of the channel output can be decoded in this case by rounding downwards or upwards (whichever is closer) to the nearest multiple of $2l+1$. Q.E.D.

Theorem 10: Let C be a systematic q-ary l-SEC code, such that the number of information digits in a codeword is k. Then, the number of check digits, r, satisfies the following condition $$r \geq \frac{k \times \log(2l+1)}{\log\left\lceil \frac{q}{2l+1} \right\rceil}.$$

Proof. Similar to the proof of Theorem 4. Q.E.D.

Now that we have identified the similarities between l-SEC and l-AEC codes, it can easily be seen that the proposed encoding / decoding algorithms for l-AEC codes can be modified in the following way to construct an l-SEC code.

l-SEC Encoding Algorithm

Input: The information vector: $(x_{k-1}, x_{k-2}, \ldots, x_0)$

Output: The encoded vector: $x=(x_{k-1}, x_{k-2}, \ldots, x_0, c_{r-1}, c_{r-2}, \ldots, c_0)$ A method of the present invention for l-SEC encoding may then include the steps of:

1. Computing a, the value of $(x_{k-1}, x_{k-2}, \ldots, x_0) \mod(2l+1)$ as a vector over $(2l+1)$:

$a = y_{k-1}(2l+1)^{k-1} + y_{k-2}(2l+1)^{k-2} + \ldots + y_0(2l+1)^0,$ where $y_i = x_i \mod(2l+1)$, $i \in \{0, 1, \ldots, k-1\}$ 2. Representing a in radix $$\left\lceil \frac{q}{2l+1} \right\rceil$$

number with r digits:

$(a_{r-1}, a_{r-2}, \ldots, a_0).$

3. Computing the check part:

$c=(c_{r-1}, c_{r-2}, \ldots, c_0).$ where $c_i = (2l+1)a_i$, $\forall i \in \{0, 1, \ldots, r-1\}$.

4. Outputting the encoded vector $x=(x_{k-1}, x_{k-2}, \ldots, x_0, c_{r-1}, c_{r-2}, \ldots, c_0)$

EXAMPLE 3

We encode the word $(5,3,7,0)$ over $Z_{10}$, assuming a maximum symmetric error level of 1. The number of check digits needed is $$r = \left\lceil \frac{4\log(2\times 1+1)}{\log\left\lceil\frac{10}{2\times 1+1}\right\rceil} \right\rceil = 4.$$

Then, $(y_3, y_2, y_1, y_0)=(2,0,1,0)$ and $a=2\times 3^3+0\times 3^2+1\times 3^1+0\times 3^0=57$. Now, $a=57$ in radix $$\left\lceil\frac{q}{2l+1}\right\rceil = \left\lceil\frac{10}{4}\right\rceil = 4$$

representation is $(0,3,2,1)$ and so, the check is $(0,9,6,3)$. Therefore, the encoded codeword is $(5,3,7,0,0,9,6,3)$.

1-SEC Decoding Algorithm

Input: The channel output: $x'=(x'_{k-1}, x'_{k-2}, \ldots, x'_0, c'_{r-1}, c'_{r-2}, \ldots, c'_0)$ Output: The recovered codeword: $(x_{k-1}, x_{k-2}, \ldots, x_0, c_{r-1}, c_{r-2}, \ldots, c_0)$ A method of the present invention for 1-SEC decoding may then include the steps of:

1. Recovering the check symbols, $(c_{r-1}, c_{r-2}, \ldots, c_0)$, by rounding each received check symbol which is not a multiple of 2l+1 either upwards or downwards to the nearest multiple of 2l+1, whichever is closer.
2. Computing a, the value of $$\left(\frac{c_{r-1}}{2l+1}, \frac{c_{r-2}}{2l+1}, \ldots, \frac{c_0}{2l+1}\right)$$

as a vector over $Z_{\lceil\frac{q}{2l+1}\rceil}$:

$$a = \left(\frac{c_{r-1}}{2l+1}\right)\left\lceil\frac{q}{2l+1}\right\rceil^{r-1} + \left(\frac{c_{r-2}}{2l+1}\right)\left\lceil\frac{q}{2l+1}\right\rceil^{r-2} + \ldots + \left(\frac{c_0}{2l+1}\right)\left\lceil\frac{q}{2l+1}\right\rceil^{0}$$

3. Representing a in radix (2l+1) number with k digits:

$y=(y_{k-1},y_{k-2},\ldots,y_0)$, where the information symbols are $(x_{k-1},x_{k-2},\ldots,x_0)$, such that $\forall i \in \{0,1,\ldots,k-1\}$ $x_i=x'_i+e_i$, where $e_i \equiv (y_i - x'_i) \bmod (2l+1)$ such that $-l \leq e_i \leq l$ and $x_i \equiv y_i (\bmod (2l+1))$.

5. Outputting the codeword: $(x_{k-1}, x_{k-2}, \ldots, x_0, c_{r-1}, c_{r-2}, \ldots, c_0)$.

EXAMPLE 4

Let the encoded word be as in Example 3 and the channel output be $x'=(4,2,8,1,1,8,7,2)$. Rounding the check symbols (that are not multiple of 3) upwards or downwards to the nearest multiple of 3 we get $(0,9,6,3)$. As in Steps 2 and 3 of the 1-SEC algorithm, we compute $a=0321_4=57$, and 57 in radix $(2l+1)=3$ representation is $y=(y_3,y_2,y_1,y_0)=(2,0,1,0)$. Thus the error vector is $e=(e_3,e_2,e_1,e_0)=(y_3-x'_3, y_2-x'_2, y_1-x'_1, y_0-x'_0)(\bmod (2l+1))=((2-4)\bmod 3,(0-2)\bmod 3,(1-8)\bmod 3,(0-1)\bmod 3)=(1,1,-1,-1)$.

Then the correct information word is $(4+1,2+1,8-1,1-1)=(5,3,7,0)$.

Since our code constructions and resulting methods are systematic, information symbols are separable from the check symbols resulting in faster encoding / decoding operations. Fortunately, the cost of having systematic code is low: we show that the rate of our 1-AEC code is very close to the one given in (1). The rate R of an error correcting code is given as $$R = \frac{k}{n}$$

where k is the number of information digits and n is the length of the code. For the code given in (1), the rate, $R_{non\text{-}systematic}$, is $$R_{non\text{-}systematic} = \frac{\log_q\left\lceil\frac{q}{l+1}\right\rceil^n}{n}$$

$$= \log_q\left\lceil\frac{q}{l+1}\right\rceil.$$

The rate of the proposed code, $R_{systematic}$, is $$R_{systematic} = \frac{k}{k+r}$$

$$= \frac{k}{k+k\left\lceil\frac{\log_q(l+1)}{\log_q\left\lceil\frac{q}{l+1}\right\rceil}\right\rceil}$$

$$= \frac{1}{1+\left\lceil\frac{\log_q(l+1)}{\log_q\left\lceil\frac{q}{l+1}\right\rceil}\right\rceil},$$

which can be approximated to $$R_{systematic} \approx \frac{1}{1+\frac{\log_q(l+1)}{\log_q\frac{q}{l+1}}}$$

$$= \frac{\log_q\frac{q}{l+1}}{\log_q\frac{q}{l+1}+\log_q(l+1)}$$

$$= \frac{\log_q\frac{q}{l+1}}{\log_q q - \log_q(l+1) + \log_q(l+1)}$$

$$= \log_q\frac{q}{l+1}.$$

The table below illustrates the closeness of the values of $R_{systematic}$ and $R_{non\text{-}systematic}$ for q=8 and q=16:

| q | l | $R_{non\text{-}systematic}$ | $R_{systematic}$ |
|---|---|---|---|
| 8 | 1 | 0.66 | 0.5 |
|   | 2 | 0.52 | 0.5 |
|   | 3 | 0.33 | 0.33 |
|   | 4 | 0.33 | 0.25 |

-continued

| q | l | $R_{non-systematic}$ | $R_{systematic}$ |
|---|---|---|---|
|  | 5 | 0.33 | 0.25 |
|  | 6 | 0.33 | 0.25 |
| 16 | 1 | 0.75 | 0.5 |
|  | 2 | 0.64 | 0.5 |
|  | 3 | 0.5 | 0.5 |
|  | 4 | 0.5 | 0.33 |
|  | 5 | 0.39 | 0.33 |
|  | 6 | 0.39 | 0.33 |
|  | 7 | 0.25 | 0.25 |
|  | 8 | 0.25 | 0.25 |
|  | 9 | 0.25 | 0.25 |
|  | 10 | 0.25 | 0.25 |
|  | 11 | 0.25 | 0.25 |
|  | 12 | 0.25 | 0.25 |
|  | 13 | 0.25 | 0.25 |
|  | 14 | 0.25 | 0.25 |

These and other advantages of the present invention will be apparent to those skilled in the art from the foregoing specification. Accordingly, it will be recognized by those skilled in the art that changes or modifications may be made to the above-described embodiments without departing from the broad inventive concepts of the invention. It should therefore be understood that this invention is not limited to the particular embodiments described herein, but is intended to include all changes and modifications that are within the scope and spirit of the invention as set forth in the claims.

Several publications are referenced in this application, the disclosures of each of these publications are incorporated by reference herein.

REFERENCES (1) R. Ahlswede, H. Aydinian, L. H. Khachatrian, and L. M. G. M. Tolhuizen, "On q-ary codes correcting all unidirectional errors of a limited magnitude", Proceedings of Ninth International Workshop on Algebraic and Combinatorial Coding Theory, Kranevo, Bulgaria, pp. 20-26, June 2004.

(2) R. Ahlswede, H. Aydinian and L. H. Khachatrian, "Unidirectional error control codes and related combinatorial problems", Proceedings of Eight International Workshop on Algebraic and Combinatorial Coding Theory, Russia, pp. 6-9, September 2002.

(3) M. Blaum, "Codes for Detecting and Correcting Unidirectional Errors", IEEE Computer Society Press, Los Alamitos, Calif., 1993.

(4) Y. Cassuto, M. Schwartz, V. Bohossian and J. Bruck, "Codes for multi-level flash memories: correcting asymmetric limited-magnitude errors", Proceedings of ISIT2007, Nice, France, June 2007.

(5) S. D. Constantin and T. R. N. Rao, "On the theory of binary asymmetric error correcting codes", Information and computation, vol. 40, pp. 20-36, 1979.

(6) B. Eitan, R. Kazerounian, A. Roy, G. Crisenza, P. Cappelletti and A. Modelli, "Multilevel flash cells and their tradeoffs", International Electron Devices Meeting, pp. 169-172, December 1996.

(7) T. Klove, "Error correcting codes for the asymmetric channel", In Dept. Mathematics, Univ. Bergen, Bergen, Norway, Tech. Rep. 1809-0781, 1995.

(8) J. R. Pierce, "Optical Channels: Practical Limits with Photon Counting", IEEE Trans. Communications, vol. 26, no. 12, pp. 1819-1821, December 1978.

(9) R. R. Varshamov, "A class of codes for asymmetric channels and a problem from the additive theory of numbers", IEEE Trans. Inform. Theory, vol. 19, no. 1, pp. 92-95, January 1973.

What is claimed is:

1. A computer-implemented method for systematic encoding of an information vector for use in correction of all asymmetric errors of maximum magnitude l and executed by a processor, comprising:

a) providing a q-ary information vector having k information digits, $(x_{k-1}, x_{k-2}, \ldots, x_0)$;

b) computing a, the value of $(x_{k-1}, x_{k-2}, \ldots, x_0)$ mod (l+1) as a vector over (l+1) according to the formula $$a = y_{k-1}(l+1)^{k-1} + y_{k-2}(l+1)^{k-2} + \ldots + y_0(l+1)^0, \text{ where}$$

$$y_i = x_i \bmod(l+1), i \in \{0, 1, \ldots, k-1\};$$

c) representing a in radix $$\left\lceil \frac{q}{l+1} \right\rceil$$

number with r digits: $(a_{r-1}, a_{r-2}, \ldots, a_0)$, where $$r \geq \frac{k \times \log(l+1)}{\log\left\lceil \frac{q}{l+1} \right\rceil};$$

d) computing the check part, c, according to the formula $c = (c_{r-1}, c_{r-2}, \ldots, c_0)$, where $c_i = (l+1)a_i, \forall i \in \{0, 1, \ldots, r-1\}$; and e) outputting an encoded vector that includes the information digits and check part, wherein any two check parts computed according to step (d) are at least l+1 apart.

2. The method according to claim 1, wherein $$r = \left\lceil \frac{k \times \log(l+1)}{\log\left\lceil \frac{q}{l+1} \right\rceil} \right\rceil.$$

3. A computer program product, comprising a non-transitory computer-readable medium having a computer readable program code embodied therein, said computer readable program code adapted to be executed to implement a method for encoding an information vector for use in systematic correction of all asymmetric errors of maximum magnitude l comprising: $A = \pi r^2$ a) providing a q-ary information vector having k information digits, $(x_{k-1}, x_{k-2}, \ldots, x_0)$;

b) computing a, the value of $(x_{k-1}, x_{k-2}, \ldots, x_0)$ mod (l+1) as a vector over (l+1) according to the formula $$a = y_{k-1}(l+1)^{k-1} + y_{k-2}(l+1)^{k-2} + \ldots + y_0(l+1)^0, \text{ where}$$

$$y_i = x_i \bmod(l+1), i \in \{0, 1, \ldots, k-1\};$$

c) representing a in radix $$\left\lceil \frac{q}{l+1} \right\rceil$$

number with r digits: $(a_{r-1}, a_{r-2}, \ldots, a_0)$, where $$r \geq \frac{k \times \log(l+1)}{\log \lceil \frac{q}{l+1} \rceil};$$

d) computing the check part, c, according to the formula $c = (c_{r-1}, c_{r-2}, \ldots, c_0)$, where $c_i = (l+1)a_i, \forall i \in \{0, 1, \ldots, r-1\}$; and e) outputting an encoded vector that includes the information digits and check part, wherein any two check parts computed according to step (d) are at least l+1 apart.

4. The computer program product according to claim 3, wherein $$r = \left\lceil \frac{k \times \log(l+1)}{\log \lceil \frac{q}{l+1} \rceil} \right\rceil.$$

5. A computer-implemented method for systematic decoding of an information vector for use in correction of all asymmetric errors of maximum magnitude $l$ and executed by a processor, comprising:

a) providing a q-ary encoded vector that includes an information vector having k received information digits, $(x'_{k-1}, x'_{k-2}, \ldots, x'_0)$ and having received check symbols $(c'_{r-1}, c'_{r-2}, \ldots, c'_0)$, where $$r \geq \frac{k \times \log(l+1)}{\log \lceil \frac{q}{l+1} \rceil};$$

b) recovering the check symbols $(c_{r-1}, c_{r-2}, \ldots, c_0)$ by rounding each received check symbol which is not a multiple of (l+1) upwards to the nearest multiple of (l+1);

c) computing a, the value of $$\left( \frac{c_{r-1}}{l+1}, \frac{c_{r-2}}{l+1}, \ldots, \frac{c_0}{l+1} \right)$$

as a vector over $$Z_{\lceil \frac{q}{l+1} \rceil}$$

as $$a = \left(\frac{c_{r-1}}{l+1}\right)\lceil \frac{q}{l+1} \rceil^{r-1} + \left(\frac{c_{r-2}}{l+1}\right)\lceil \frac{q}{l+1} \rceil^{r-2} + \ldots + \left(\frac{c_0}{l+1}\right)\lceil \frac{q}{l+1} \rceil^0;$$

d) representing a in radix (l+1) number with k digits as $y = (y_{k-1}, y_{k-2}, \ldots, y_0)$;

e) computing $e_i = (y_i - x'_i) \mod (l+1)$; and computing the corrected codeword, $(x_{k-1}, x_{k-2}, \ldots, x_0)$, as $x_i = x'_i + e_i$, where $i = 0, 1, \ldots, k-1$, wherein any two of the check symbols are at least l+1 apart.

6. The method according to claim 5, wherein $$r = \left\lceil \frac{k \times \log(l+1)}{\log \lceil \frac{q}{l+1} \rceil} \right\rceil.$$

7. A computer program product, comprising a non-transitory computer-readable medium having a computer readable program code embodied therein, said computer readable program code adapted to be executed to implement a method for decoding an information vector for use in systematic correction of all asymmetric errors of maximum magnitude $l$ comprising:

a) providing a q-ary encoded vector that includes an information vector having k received information digits, $(x'_{k-1}, x'_{k-2}, \ldots, x'_0)$ and having received check symbols $(c'_{r-1}, c'_{r-2}, \ldots, c'_0)$, where $$r \geq \frac{k \times \log(l+1)}{\log \lceil \frac{q}{l+1} \rceil};$$

b) recovering the check symbols $(c_{r-1}, c_{r-2}, \ldots, c_0)$ by rounding each received check symbol which is not a multiple of (l+1) upwards to the nearest multiple of (l+1);

c) computing a, the value of $$\left( \frac{c_{r-1}}{l+1}, \frac{c_{r-2}}{l+1}, \ldots, \frac{c_0}{l+1} \right)$$

as a vector over $$Z_{\lceil \frac{q}{l+1} \rceil}$$

as $$a = \left(\frac{c_{r-1}}{l+1}\right)\lceil \frac{q}{l+1} \rceil^{r-1} + \left(\frac{c_{r-2}}{l+1}\right)\lceil \frac{q}{l+1} \rceil^{r-2} + \ldots + \left(\frac{c_0}{l+1}\right)\lceil \frac{q}{l+1} \rceil^0;$$

d) representing a in radix (l+1) number with k digits as $y = (y_{k-1}, y_{k-2}, \ldots, y_0)$;

e) computing $e_i = (y_i - x'_i) \mod (l+1)$; and f) computing the corrected codeword, $(x_{k-1}, x_{k-2}, \ldots, x_0)$, as $x'_i + e_i$, where $i = 0, 1, \ldots, k-1$, wherein any two of the check symbols are at least l+1 apart.

8. The computer program product according to claim 7, wherein $$r = \left\lceil \frac{k \times \log(l+1)}{\log \lceil \frac{q}{l+1} \rceil} \right\rceil.$$

9. A computer-implemented method for systematic encoding of an information vector for use in correction of all symmetric errors of maximum magnitude $l$ and executed by a processor, comprising:

a) providing a q-ary information vector having k information digits, $(x_{k-1}, x_{k-2}, \ldots, x_0)$;

b) computing a, the value of $(x_{k-1},x_{k-2},\ldots,x_0)\bmod(2l+1)$ as a vector over $(2l+1)$ according to the formula $$a=y_{k-1}(2l+1)^{k-1}+y_{k-2}(2l+1)^{k-2}+\ldots+y_0(2l+1)^0,$$

where $y_i=x_i\bmod(2l+1), i\in\{0,1,\ldots,k-1\}$;
c) representing a in radix $$\lceil\frac{q}{2l+1}\rceil$$

number with r digits, $(a_{r-1},a_{r-2},\ldots,a_0)$, where $$r\geq\frac{k\times\log(2l+1)}{\log\lceil\frac{q}{2l+1}\rceil};$$

d) computing the check part as $c=(c_{r-1},c_{r-2},\ldots,c_0)$, where $c_i=(2l+1)a_i, \forall i\in\{0,1,\ldots,r-1\}$; and
e) outputting an encoded vector that includes the information digits and check part, wherein any two check parts computed according to step (d) are at least $l+1$ apart.

10. The method according to claim 9, wherein $$r=\frac{k\times\log(2l+1)}{\log\lceil\frac{q}{2l+1}\rceil}.$$

11. A computer program product, comprising a non-transitory computer-readable medium having a computer readable program code embodied therein, said computer readable program code adapted to be executed to implement a method for encoding an information vector for use in systematic correction of all symmetric errors of maximum magnitude $l$ comprising:
a) providing a q-ary information vector having k information digits, $(x_{k-1},x_{k-2},\ldots,x_0)$;
b) computing a, the value of $(x_{k-1},x_{k-2},\ldots,x_0)\bmod(2l+1)$ as a vector over $(2l+1)$ according to the formula $$a=y_{k-1}(2l+1)^{k-1}+y_{k-2}(2l+1)^{k-2}+\ldots+y_0(2l+1)^0,$$

where $y_i=x_i\bmod(2l+1), i\in\{0,1,\ldots,k-1\}$;
c) representing a in radix $$\lceil\frac{q}{2l+1}\rceil$$

number with r digits, $(a_{r-1},a_{r-2},\ldots,a_0)$, where $$r\geq\frac{k\times\log(2l+1)}{\log\lceil\frac{q}{2l+1}\rceil};$$

d) computing the check part as $c=(c_{r-1},c_{r-2},\ldots,c_0)$, where $c_i=(2l+1)a_i, \forall i\in\{0,1,\ldots,r-1\}$; and
e) outputting an encoded vector that includes the information digits and check part, wherein any two check parts computed according to step (d) are at least $l+1$ apart.

12. The computer program product according to claim 11, wherein $$r=\frac{k\times\log(2l+1)}{\log\lceil\frac{q}{2l+1}\rceil}.$$

13. A computer-implemented method for systematic decoding of an information vector for use in correction of all symmetric errors of maximum magnitude l and executed by a processor, comprising:
a) providing a q-ary encoded vector that includes an information vector having k received information digits, $(x'_{k-1},x'_{k-2},\ldots,x'_0)$ and having received check symbols $(c'_{r-1},c'_{r-2},\ldots,c'_0)$, where $$r\geq\frac{k\times\log(2l+1)}{\log\lceil\frac{q}{2l+1}\rceil};$$

b) recovering the check symbols by rounding each received check symbol $(c_{r-1},c_{r-2},\ldots,c_0)$ which is not a multiple of $(2l+1)$ either upwards or downwards to the nearest multiple of $(2l+1)$, whichever is closer;
c) computing a, the value of $$\left(\frac{c_{r-1}}{2l+1},\frac{c_{r-2}}{2l+1},\ldots,\frac{c_0}{2l+1}\right)$$

as a vector over $$Z_{\lceil\frac{q}{2l+1}\rceil}$$

as $$a=\left(\frac{c_{r-1}}{2l+1}\right)\lceil\frac{q}{2l+1}\rceil^{r-1}+\left(\frac{c_{r-2}}{2l+1}\right)\lceil\frac{q}{2l+1}\rceil^{r-2}+\ldots+\left(\frac{c_0}{2l+1}\right)\lceil\frac{q}{2l+1}\rceil^0;$$

d) representing a in radix $(2l+1)$ number with k digits as $y=(y_{k-1},y_{k-2},\ldots,y_0)$;
e) computing $e_i=(y_i-x'_i)\bmod(2l+1)$ such that $-l\leq e_i\leq l$; and
f) computing the corrected codeword, $(x_{k-1},x_{k-2},\ldots,x_0)$, as $x_i=x'_i+e_i$,
where $i=0,1,\ldots,k-1$, wherein any two check symbols are at least $l+1$ apart.

14. The method according to claim 13, wherein $$r=\frac{k\times\log(2l+1)}{\log\lceil\frac{q}{2l+1}\rceil}.$$

15. A computer program product, comprising a non-transitory computer-readable medium having a computer readable program code embodied therein, said computer readable program code adapted to be executed to implement a method for decoding an information vector for use in systematic correction of all symmetric errors of maximum magnitude $l$ comprising:

a) providing a q-ary encoded vector that includes an information vector having k received information digits, $(x'_{k-1}, x'_{k-2}, \ldots, x'_0)$ and having received check symbols $(c'_{r-1}, c'_{r-2}, \ldots, c'_0)$, where $$r \geq \frac{k \times \log(2l+1)}{\log\left\lceil \frac{q}{2l+1} \right\rceil};$$

b) recovering the check symbols $(c_{r-1}, c_{r-2}, \ldots, c_0)$ by rounding each received check symbol which is not a multiple of $(2l+1)$ either upwards or downwards to the nearest multiple of $(2l+1)$, whichever is closer;

c) computing a, the value of $$\left( \frac{c_{r-1}}{2l+1}, \frac{c_{r-2}}{2l+1}, \ldots, \frac{c_0}{2l+1} \right)$$

as a vector over $$Z_{\left\lceil \frac{q}{2l+1} \right\rceil}$$

as $$a = \left(\frac{c_{r-1}}{2l+1}\right)\left\lceil \frac{q}{2l+1} \right\rceil^{r-1} + \left(\frac{c_{r-2}}{2l+1}\right)\left\lceil \frac{q}{2l+1} \right\rceil^{r-2} + \ldots + \left(\frac{c_0}{2l+1}\right)\left\lceil \frac{q}{2l+1} \right\rceil^{0};$$

d) representing a in radix $(2l+1)$ number with k digits as $y = (y_{k-1}, y_{k-2}, \ldots, y_0)$;

e) computing $e_i = (y_i - x'_i) \mod(2l+1)$ such that $-l \leq e_i \leq l$; and f) computing the corrected codeword, $(x_{k-1}, x_{k-2}, \ldots, x_0)$, as $x_i = x'_i + e_i$, where $i = 0, 1, \ldots, k-1$, wherein any two check symbols are at least $l+1$ apart.

16. The computer program product according to claim 15, wherein $$r = \frac{k \times \log(2l+1)}{\log\left\lceil \frac{q}{2l+1} \right\rceil}.$$

\* \* \* \* \*